(12) United States Patent
Simula et al.

(10) Patent No.: US 10,849,235 B1
(45) Date of Patent: Nov. 24, 2020

(54) METHOD OF MANUFACTURE OF A STRUCTURE AND STRUCTURE

(71) Applicant: Tactotek Oy, Oulunsalo (FI)

(72) Inventors: Tomi Simula, Oulunsalo (FI); Mika Paani, Oulunsalo (FI); Miikka Kärnä, Oulunsalo (FI); Outi Rusanen, Oulunsalo (FI); Johanna Juvani, Oulunsalo (FI); Tapio Rautio, Oulunsalo (FI); Marko Suo-Anttila, Oulunsalo (FI); Mikko Heikkinen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/879,010

(22) Filed: May 20, 2020

(51) Int. Cl.
| | | |
|---|---|---|
| H05K 1/00 | (2006.01) | |
| H05K 1/02 | (2006.01) | |
| H05K 1/11 | (2006.01) | |
| H05K 1/14 | (2006.01) | |
| H05K 1/16 | (2006.01) | |
| H05K 1/18 | (2006.01) | |
| H05K 3/00 | (2006.01) | |
| H05K 3/12 | (2006.01) | |
| H05K 3/28 | (2006.01) | |

(Continued)

(52) U.S. Cl.
CPC ....... *H05K 3/284* (2013.01); *B29C 45/14819* (2013.01); *H05K 1/181* (2013.01); *H05K 5/03* (2013.01); *H05K 5/065* (2013.01); *B29K 2101/12* (2013.01); *B29L 2031/3406* (2013.01); *H05K 2203/1316* (2013.01); *H05K 2203/1327* (2013.01)

(58) Field of Classification Search
CPC .. H05K 1/00; H05K 1/02; H05K 1/04; H05K 1/11; H05K 1/14; H05K 1/16; H05K 1/18; H05K 3/00; H05K 3/12; H05K 3/28; H05K 3/30; H05K 3/32; H05K 3/46; H05K 5/10; H05K 5/12; H01L 21/00; H01L 21/12; H01L 21/48; H01L 21/50; H01L 21/56; H01L 21/67; H01L 23/14; H01L 23/28; H01L 23/31; H01L 23/48; H01L 23/50; H01L 23/52; H01L 23/498

USPC .......... 361/760, 809; 257/98, 668, 690, 698, 257/700, 701, 723, 738, 778, 789; 29/840; 438/106, 108, 112

See application file for complete search history.

(56) References Cited

U.S. PATENT DOCUMENTS 5,075,760 A * 12/1991 Nakashima ......... H01L 23/4985
257/668
6,072,239 A *  6/2000 Yoneda ............. H01L 21/67138
257/730

(Continued)

*Primary Examiner* — Xiaoliang Chen
(74) *Attorney, Agent, or Firm* — Robert P. Michal, Esq.; Carter, DeLuca & Farrell LLP (57) ABSTRACT

A method of manufacture of a structure includes obtaining or producing a functional electronics assembly including at least a first substrate, at least one electronics component on the first substrate, and at least one connection portion, providing the functional electronics assembly on a first substrate film, wherein the functional electronics assembly is connected to the first substrate film via the at least one connection portion, and providing first material to at least partly embed the at least one electronics component into the first material. The first substrate film is adapted to include a recess defining a volume, and the at least one electronics component is arranged at least partly in the volume.

18 Claims, 8 Drawing Sheets

(51) Int. Cl.
*H05K 3/32* (2006.01)
*H05K 3/46* (2006.01)
*H01L 21/00* (2006.01)
*H01L 21/12* (2006.01)
*H01L 21/48* (2006.01)
*H01L 21/50* (2006.01)
*H01L 21/56* (2006.01)
*H01L 21/67* (2006.01)
*H01L 23/14* (2006.01)
*H01L 23/28* (2006.01)
*H01L 23/31* (2006.01)
*H01L 23/48* (2006.01)
*H01L 23/50* (2006.01)
*H01L 23/52* (2006.01)
*H01L 23/498* (2006.01)
*H05K 5/03* (2006.01)
*H05K 5/06* (2006.01)
*B29C 45/14* (2006.01)
*B29K 101/12* (2006.01)
*B29L 31/34* (2006.01)

(56) References Cited

U.S. PATENT DOCUMENTS

| | | | | |
|---|---|---|---|---|
| 6,134,776 A * | 10/2000 | Hoffmeyer | H01L 23/3672 | 156/94 |
| 6,555,755 B1 * | 4/2003 | Yanagisawa | H01L 23/4985 | 174/254 |
| 6,744,120 B1 * | 6/2004 | Yanagisawa | H01L 23/49572 | 257/668 |
| 7,335,529 B2 * | 2/2008 | Miyaki | H01L 21/566 | 438/106 |
| 7,944,043 B1 * | 5/2011 | Chung | H01L 21/568 | 257/698 |
| 9,735,398 B2 * | 8/2017 | Aoyama | H01L 51/003 | |
| 10,057,989 B1 * | 8/2018 | Heikkinen | H05K 1/148 | |
| 2001/0010947 A1 * | 8/2001 | Hsu | H01L 23/3128 | 438/118 |
| 2003/0222344 A1 * | 12/2003 | Hosoyamada | H01L 23/49822 | 257/738 |
| 2007/0085426 A1 * | 4/2007 | Lee | H02K 1/04 | 310/43 |
| 2008/0023850 A1 * | 1/2008 | Lu | H01L 23/49816 | 257/778 |
| 2008/0076209 A1 * | 3/2008 | Klink | H01L 23/5389 | 438/112 |
| 2008/0100732 A1 * | 5/2008 | Minamio | H04N 5/2257 | 348/294 |
| 2010/0165595 A1 * | 7/2010 | Kim | H01L 23/4985 | 361/809 |
| 2010/0193935 A1 * | 8/2010 | Lachner | H01L 24/19 | 257/693 |
| 2015/0028372 A1 * | 1/2015 | Nakanishi | H01L 33/486 | 257/98 |
| 2016/0295702 A1 * | 10/2016 | Heikkinen | H05K 1/0274 | |
| 2016/0322548 A1 * | 11/2016 | Abe | H01L 33/60 | |
| 2017/0094776 A1 * | 3/2017 | Heikkinen | H05K 3/4015 | |
| 2017/0094800 A1 * | 3/2017 | Keranen | H05K 3/28 | |
| 2017/0135198 A1 * | 5/2017 | Keranen | H05K 1/16 | |
| 2017/0311448 A1 * | 10/2017 | Kawabata | H01F 1/0306 | |
| 2019/0069409 A1 * | 2/2019 | Keranen | H05K 3/284 | |
| 2019/0287892 A1 * | 9/2019 | Saaski | H01L 25/0657 | |

* cited by examiner

METHOD OF MANUFACTURE OF A STRUCTURE AND STRUCTURE

FIELD OF THE INVENTION

The present invention relates in general to functional, integrated assemblies such as electronic assemblies. In particular, however not exclusively, the present invention concerns structures for implementing functionality or functionalities in such assemblies including e.g. a molded, optionally injection molded, material layer.

BACKGROUND

There exists a variety of different stacked assemblies and structures in the context of electronics and electronic products. The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment. In typical solutions, electrical circuits have been produced on a printed circuit board (PCB) or a on substrate film, after which they have been overmolded by plastic material. Known structures and methods have, however, some drawbacks, still depending on the associated use scenario. In order to produce an electronic assembly having one or more functionalities, typically rather complex electrical circuits for achieving these functionalities have to be produced on a substrate by printing and/or utilizing SMDs, and then be overmolded by plastic material.

However, in the known solutions, the implementation of complex functionalities may face reliability risks and assembly yield related issues arising from challenges in integrating very dense components and components with complex geometries. Furthermore, the electronic assembly may require, for example, the use of external control electronics which reduces degree of integration and makes the structures less attractive. Directly integrating a possibly large number of dense components and components of complex geometry onto a potentially considerable larger substrate can be challenging and potentially very risky, as reliability will often be affected by molding pressure, for instance, and the assembly yields in different production phases can be very low. Subassemblies mounted or arranged on a PCB and covered with a plastic layer can suffer from mismatch e.g. in terms of thermal expansion, be difficult to be overmolded due to their complex structure, and exhibit stresses in the structure which can tear the subassemblies off their electrical contacts. Challenges in thermal management may also generally cause issues such as overheating.

Accordingly, both direct provision of functional or specifically electrical elements such as related components on a larger host substrate and preparation of collective subassemblies upfront for subsequent mounting thereon have their own downsides in terms of electronics vulnerability, structural and installation complexity as well as thermal management, for example, whereupon there remains room for improvement in terms of related improved or alternative manufacturing techniques and resulting end structures.

Embedding large chunks of materials, or inserts, in an otherwise relatively thin injection molded part is challenging as the large insert will require greater local thickness for the part. The open volume around the insert in the thicker portion of the part results in significant mass concentration around the insert when the molding material is provided therein. This portion cools for quite some time after the rest of the part has already cooled down causing local stress as the molded material mass shrinks during the cooling. Furthermore, as the part cools down, the material shrinks unevenly causing visual defects in form of shrink marks and warpage. This uneven shrinkage will result in high internal stress, potentially leading to stress cracking and premature part failure. There is thus still need to develop structures and methods related both to IMSE technology and integrated electronics in general.

SUMMARY

The objective of the present invention is to at least alleviate one or more of the above drawbacks associated with the known solutions in the context of structures including functional elements such as electronics and optionally utilizing molded or cast material layers or structures.

The objective is achieved with various embodiments of a method of manufacture of a structure and a structure as defined by the respective independent claims.

According to a first aspect, a method of manufacture of a structure is provided. The method comprises obtaining or producing a functional electronics assembly comprising at least a first substrate, at least one electronics component on the first substrate, and at least one connection portion. The method also comprises providing the functional electronics assembly on a first substrate film, wherein the functional electronics assembly is connected to the first substrate film via the at least one connection portion. The method further comprises providing first material, preferably in a flowable state, to at least partly embed the at least one electronics component into the first material. In the method, the first substrate film is adapted, such as formed, e.g. utilizing thermoforming, cold forming, vacuum forming, low pressure forming, pressure forming, utilizing the Niebling process, to comprise a recess defining a volume, and the at least one electronics component is arranged at least partly in the volume.

Additionally, the method may comprise injection molding a material layer on the first substrate film to embed the first material, and thereby also the functional electronics assembly, in the material layer.

In various embodiments, the adapting may comprise forming the first substrate film to produce the recess.

In various embodiments, the adapting may comprise forming the first substrate film at least at a position of the functional electronics assembly provided on the first substrate film to arrange the functional electronics assembly into the recess.

In various embodiments, the first material may be provided into the recess.

In some embodiments, the first material may be provided to at least partially embed the at least one electronics component of the functional electronics assembly being provided on the first substrate film, the providing being performed prior to the adapting of the first substrate film to comprise the recess. In addition, the method may comprise curing a surface layer of the first material prior to the adapting. Alternatively or in addition, the method may comprise heating the first material prior to the adapting.

In various embodiments, the method may comprise providing the functional electronics assembly to the first substrate film so that a surface on opposite side of the first substrate relative to a side comprising the at least one electronics component is arranged to cover the recess and face away from the recess.

In various embodiments, an outer surface facing out of the recess may be defined by the first material. Optionally, a primer material may be applied on the outer surface for improving adherence to the molding material, if any. The primer material may comprise, for example, acrylic lacquer.

In various embodiments, the method may comprise providing a lid member to cover the recess. The lid member may be a thermoplastic film or at least a portion thereof. Preferably, the lid member may be functional, such as having certain specific optical or mechanical properties. Alternatively or in addition, the lid member may at least partly conform to the shape of a portion of the recess surrounding the functional electronics assembly.

In various embodiments, an outer surface facing out of the recess may be configured to provide an adhesion surface for a material layer to be molded on the surface. Furthermore, the outer surface may be the surface on the opposite side of the first substrate relative to a side comprising the at least one electronics component, or the outer surface being defined by the first material, or a surface of the lid facing away from the recess, respectively.

In various embodiments, the method may comprise configuring a surface of the recess facing away from the recess to align with surrounding surface portions of the first substrate film to at least locally provide a uniform surface at and in vicinity of but outside the recess.

The functional electronics assembly may a component-like element, such as able to be assembled by a surface mount technology component placement system or a pick-and-place machine.

According to a second aspect, a structure is provided. The structure comprises a first substrate film comprising a recess defining a volume, and a functional electronics assembly comprising at least a first substrate, at least one electronics component on the first substrate, and at least one connection portion. The functional electronics assembly is connected to the first substrate film via the at least one connection portion and the at least one electronics component is arranged at least partly into the volume and at least part of the at least one electronics component is embedded into a first material arranged into the recess.

Furthermore, the structure may comprise an injection molded material layer on the first substrate film embedding the first material, and thereby also the functional electronics assembly, between the injection molded material layer and the first substrate film.

Still further, alternatively or in addition, a lid member may be arranged to at least partly cover the recess. Optionally, an outer surface of the lid member comprises at least one further electronics component, the outer surface being the surface on the opposite side of the lid member relative to the recess. In various embodiments, the lid member may, however, not necessarily, be overmolded with the injection molded material layer. Thus, in many embodiments, the lid member may reside between the injection molded material layer and the recess. Preferably, the at least one further electronics component may be embedded into the injection molded material layer.

The present invention provides different advantages over a great variety of known solutions, naturally depending on each particular embodiment thereof. The present invention provides advantages over known solutions, for example, in that the functional electronics assemblies are embedded in structures in a way that the assemblies become protected and have a uniform surface of the structure. In various embodiments, the uniform material layer evens out the geometry, allowing surface mount technology component placement systems, or pick-and-place machines, to pick up the structure more easily. Furthermore, another advantage is that embedded structure does not change of the thickness of the injection molded part to be molded thereon, meaning that there is a lower risk of shrinkage marks, residual stress and other molding defects related to changes in molding layer thickness. According to various embodiments, protection of the elements of the assembly is improved while enabling the molding thickness to remain largely constant over the entire part area, reducing risk for shrinkage-induced issues.

Various other advantages will become clear to a skilled person based on the following detailed description.

The expression "a number of" may herein refer to any positive integer starting from one (1), that is being at least one.

The expression "a plurality of" may refer to any positive integer starting from two (2), that is being at least two.

The terms "first", "second" and "third" are herein used to distinguish one element from other element, and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also unrecited features. The features recited in depending claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Various embodiments of structures, such as electrical and/or functional nodes, related further assemblies, multi-layer structures and methods of manufacture are described below, to be optionally flexibly and/or selectively combined by a person skilled in the art upon need to come up with new embodiments best suitable for each concerned use scenario.

Figure 1:
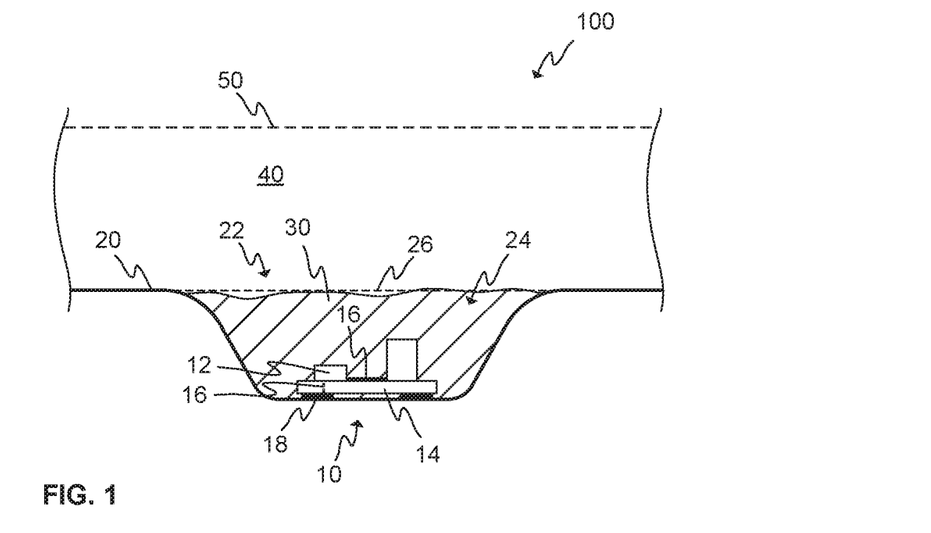
FIG. 1 illustrates schematically a structure according to an embodiment of the present invention.

FIG. 1 illustrates schematically a structure 100 according to an embodiment of the present invention. The structure 100 preferably comprises a first substrate film 20 comprising a recess 22 defining a volume 24, a functional electronics assembly 10 comprising, optionally, at least a first substrate 14, at least one electronics component 12 on the first substrate 14, and at least one connection portion 18. The functional electronics assembly 10 may be connected to the first substrate film 20 via the at least one connection portion 18 and the at least one electronics component 12 may, preferably, be arranged at least partly into the volume and at least part of the at least one electronics component 12 is embedded into a first material 30 arranged into the recess 22, preferably in a flowing state or generally in pre-solidified state. In FIG. 1, the electronics component 12 is, in fact, completely embedded in the first material 30.

Furthermore, the first material 30, besides, for example, reducing detrimental effects of thermal expansion differences between various elements, advantageously protects the components of in the recess 22 when being overmolded by plastic, such as by injection molding, and/or generally covered by further material, for instance.

There may, preferably, be conductors 16, such as traces, in the assembly 10. The conductors 16 may be arranged between a plurality of electronics components 12, and/or between the at least one electronics component 12 and the connection portion 18 which may be a (printed) pad or trace, for instance.

Any of the elements 12, 16, 18 may be of attachable or mountable (ready-made) type, or directly additively printable (screen printed, inkjetted, etc.).

Regarding the recess 22, it may exhibit the shape of a rectangle, trapezoid, frustum, isosceles trapezoid, isosceles trapezoid with shorter base facing the substrate film, isosceles trapezoid with longer base facing the substrate film, rounded shape, rounded rectangle, rounded isosceles trapezoid, triangle, rounded triangle, semicircle, dome, convex, bell-shape, mushroom-shape, conical, semi-ellipse, and droplet or column shape, to name a few. Therefore, a skilled person shall realize the fact that the shown embodiments of the structure 100 with rounded isosceles trapezoid shape is merely exemplary.

The first substrate 14 may be e.g. a piece of planar, optionally flexible, substrate film or a rigid PCB (printed circuit board) type substrate.

The first substrate 10 may accommodate or host a number of different, preferably functional, elements such as electrical elements e.g. on at least first side thereof, which in this context refers to e.g. electrical, electro-optical, electromechanical or specifically electronic components 12 and/or conductors 16 such as traces, or 'wiring', and/or contact pads for electrically connecting components together according to a selected circuit layout or circuit design, for instance. Also the opposite second side may contain a number of electrical elements 12, 16 and/or other elements generally discussed herein, and/or be utilized for defining an outer surface of the structure 100. Optionally, the at least one electronics component 12 may be arranged on opposite side of the first substrate 14 relative to the connection portion 18, however, the connection portion 18 could, alternatively or in addition, be arranged on the same side.

In various embodiments, the at least one electronics element may comprises at least one element selected from the group consisting of: electronic component, integrated circuit, electromechanical component, active component, passive, component, electrical conductor, printed electrical conductor, printed electronics-produced electrical conductor, electrode, contact pad, conductor trace, electro-optical (or optoelectronic) component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, microelectromechanical (MEMS) component, UI element, user input element, vibration element, sound producing element, communication element, transmitter, receiver, transceiver, antenna, resonator, wireless communication element, wireless tag, radio tag, tag reader, data processing element, data storage or memory element, and electronic sub-assembly.

Yet, a number of connecting elements 16 for functionally, preferably electrically, such as galvanically, and/or electromagnetically, e.g. inductively, capacitively or optically using e.g. light, coupling the structure 100 and one or more electrical elements therein to an external electrical circuit such as a circuit on another portion of the first substrate film 10 or of a host structure may be provided in the structure 100. Thus, both wired and wireless connecting technology may be applied.

Regarding various embodiments of the present invention, the volume 24 of recess 22 is defined substantially by the portion of the surface of the first substrate film 20 defining the recess 22, that is the inner surface of the recess 22 on the first side of the substrate film 20. With respect to the end of the recess 22 which does not have portion of the first substrate film 20, the volume 24 is limited substantially to an imaginary surface 26 (shown with a dashed line in FIG. 1) which together with the portion(s) of the first substrate film 20 surrounding the recess 22 define a substantially uniform surface. In FIG. 1, the imaginary surface 26 is shown to be aligned with the surrounding portions and, in this case, defines a plane or planar surface.

In various embodiments, however, the imaginary surface 26 with the surrounding portions do not necessarily define a uniform, or planar, surface and still the structure 100 may produce the technical effects and advantages of the present invention. Thus, the imaginary surface 26 may be planar, or it may have regular or irregular shapes such as shown in FIG. 1 regarding the surface of the first material 30. Furthermore, the imaginary surface 26, whether having a planar surface or having shape(s) making the imaginary surface 26 a non-planar surface, may also be slightly elevated from the recess 22, that is being at least partly further away from the recess 22 with respect to the aligned position, or may be slightly lower, that is at least partly less away from the recess 22 with respect to the aligned position.

In some embodiments, the volume 24 may be limited, for example, to at most 1.0 millimeter, preferably at most 0.5 millimeters, or most preferably at most 0.25 millimeters higher or lower than the aligned position.

As shown in FIG. 1, the functional electronics assembly 10 may be connected and/or attached to the first substrate film 20 on the bottom of the recess 22. Furthermore, the first substrate 14, having a first surface on the first side and a second surface on the second side, may have the at least one electronics component 12 on the first surface of the first substrate 14 and, in this case, arranged to face away from the first substrate film 20.

In some embodiments, there may be additional layer or layers, such as laminated or molded layer(s), arranged to cover or embed the first material 30, and thereby also the functional electronics assembly 10, between the additional layer(s) and the first substrate film 20, and at least the surrounding portions of the first substrate film 20.

In an embodiment, a primer material may be applied on the outer surface of the first material 30, that is the surface facing away from the recess 22, for improving adherence to a molding material, if any. The primer material may comprise, for example, acrylic lacquer.

In various embodiments, the structure 100 may optionally comprise an injection molded material layer 40 on the first substrate film 20 embedding the first material 30, and thereby also the functional electronics assembly 10, between the injection molded material layer 40 and the first substrate film 20.

In various embodiments, the molding material layer 40 may be a preferably flowable/flowing and further preferably thereafter solidified, preferably plastic, material that is subsequently provided in contact with the first material 30 and optionally selected from the group consisting of: thermoplastic material, polymeric or alike material, lignin or alike material, TPU (thermoplastic polyurethane), polymer, elastomeric material, PC (Poly Carbonate), PMMA (Polymethyl methacrylate), ABS (Acrylonitrile butadiene styrene), PET (Polyethylene terephthalate), PA (polyamide), GPPS (General Purpose Polystyrene), PCPA (pentachlorophenyl acrylate), cellulose based thermoplastic material, and MS (Methyl Methacrylate Styrene) resin. The plastic material may be molded or cast, for instance, upon the first material layer and the node in general. Optionally, the first material 30 is such as to adhere to the molding material layer 40.

In various embodiments, the first material 30 may be selected and/or processed so as to be adherent to a material of the substrate and/or of said at least one functional or specifically, electronics element, the concerned material preferably comprising at least one material selected from the group consisting of: polymer, conductive polymer, thermoplastic material, organic material, elastomeric material, electrically insulating material, PMMA, PC, polyimide, MS resin, glass, organic material, fibrous material, PET, metal, wood, solid wood, veneer, plywood, bark, tree bark, birch bark, cork, (natural) leather, (natural) textile or fabric material, textile material, cotton, wool, linen, silk, formable material, thermoformable material, cold-formable material, gold, copper, tin, silver, palladium, solder resist, thermally curable solder resist, UV (ultraviolet) curable solder resist, epoxy, lignin or alike material, cellulose based material, multicomponent epoxy, ink, and conductive ink.

In various embodiments, instead of or prior to the molding material layer 40, a further material layer may be provided in contact with the first material 30 and optionally selected from the group consisting of: metal, wood, solid wood, veneer, plywood, bark, tree bark, birch bark, cork, leather, fabric or textile, natural leather, natural textile or fabric material, textile material, cotton, wool, linen, silk, formable material, thermoformable material, cold-formable material, epoxy, multi-component epoxy, ink, and conductive ink. Optionally, the first material 30 is such as to adhere to the further material layer.

Still further, there may be a second substrate film 50, such as of thermoplastic material, on the opposite side of the injection molded material layer 40 relative to the first material 30 and the functional electronics assembly 10.

In a further embodiment, there may be air ventilation holes arranged to the surround portions of the first substrate film 20, that is close to the edge of the recess 22. The air ventilation holes may prevent formation of air pockets in case the first material 30 and/or the assembly 10 is being overmolded with a molding material.

In various embodiments, the assembly 10 may comprise a thermally conductive first material 30 to operate, in addition to being e.g. a protective layer, as a thermal conductor.

Alternatively or in addition, the molding material layer 40, if any, may be of thermally conductive material.

In various embodiments, the hardness of the first material 30 is preferably about 85 or less on Shore scale A or about 40 or less on Shore scale D.

In various embodiments, the modulus of elasticity of the first material 30 is preferably about 2000 MPA or less, more preferably about 500 MPA or less, and most preferably about 100 MPA or less.

In various embodiments, material(s) of the substrate(s) (film(s)) and/or of further layer(s) may at least partially be optically substantially opaque or at least translucent having regard to predefined wavelengths e.g. in visible spectrum. This is also applicable to the molded or cast material layer. The concerned element such as a film type substrate, coating or other layer, optionally defining at least portion of the exterior (surface) of the structure, or being at least visible or otherwise perceivable therethrough, may have been provided with a number of visually distinguishable, decorative/aesthetic and/or informative, features such as graphical pattern and/or color thereon or therein. The features may have been provided on the same side of the substrate with the electronics element 12 so that they have been also at least partially sealed, or on the opposite side and thus may or may not be sealed by the plastic material(s) through the associated overmolding procedure of the first material 30 and/or the assembly 10, for instance. Accordingly, IML (in-mold labeling)/IMD (in-mold decoration) technique is applicable. The used materials may be at least partially, i.e. at least in places, optically substantially transparent to radiation such as visible light emitted by the electronics thereon. The transmittance may be about 80%, 85%, 90%, 95% or higher, for example. The molded or cast material(s) may comprise thermoplastic and/or thermosetting material(s). Thickness of the molded or otherwise produced layer(s) may vary depending on the embodiment. It may be, for example, in the order of magnitude of less than one, one, few or tens of millimeters. The material(s) may be e.g. electrically insulating.

Figure 2:
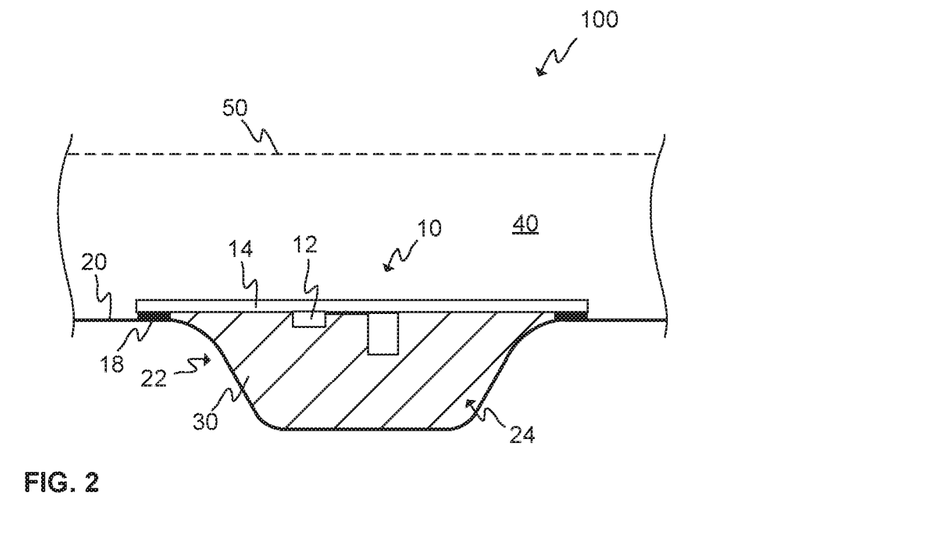
FIG. 2 illustrates schematically a structure according to an embodiment of the present invention.

FIG. 2 illustrates schematically a structure 100 according to an embodiment of the present invention. The structure 100 preferably comprises a first substrate film 20 comprising a recess 22 defining a volume 24, a functional electronics assembly 10 comprising, optionally, at least a first substrate 14, at least one electronics component 12 on the first substrate 14, and at least one connection portion 18. The functional electronics assembly 10 may be connected to the first substrate film 20 via the at least one connection portion 18 and the at least one electronics component 12 may, preferably, be arranged at least partly into the volume and at least part of the at least one electronics component 12 is embedded into a first material 30 arranged into the recess 22. In FIG. 1, the electronics component 12 is, in fact, completely embedded in the first material 30. Optionally, the at least one electronics component 12 may be arranged on the same side of the first substrate 14 relative to the connection portion 18, however, the connection portion 18 could, alternatively or in addition, be arranged on the opposite side.

What is stated hereinabove about the optional injection molded material layer 40, the second substrate film 50, and the additionally layer(s), apply also to embodiments in accordance with FIG. 2.

In FIG. 2, the functional electronics assembly 10 may be connected and/or attached to the first substrate film 20 on top of the recess 22. While it is true that at least part of the at least one electronics component 12 is embedded into a first material 30, the first substrate 14 may or may not be embedded in the first material 30. The first material 30 may be arranged to be in contact with the first surface of the first substrate having the at least one electronics component 12, however, there may, alternatively, be a small distance, such as at least at portions of the first substrate 14, between the first substrate 14 and the first material 30 while still embedding at least part of the at least one electronics component 12.

The connection portion 18 or portions 18 may preferably be arranged to be outside of the recess 22, such as on the surrounding portions of the first substrate film 20, in embodiments accordance with FIG. 2.

Furthermore, the second surface of the first substrate 14 provides substantially uniform surface over the recess 22. Alternatively, the first material 30 may be arranged to embed both sides of the first substrate 14. In FIG. 2, the first material 30 would then be at least partly further away from the recess 22 with respect to the aligned position as defined hereinabove with respect to FIG. 1.

In various embodiment, in addition to the assembly 10, the first substrate film 20, such as of e.g. plastic and/or organic material, may comprise provided thereon other elements such as electronics, optics, thermal management elements, etc. The substrate film 20 may preferably comprise electrical connecting elements such as contacts or contact areas provided with electrically conductive material to which the assembly 10 may be, for example, attached or connected by using conductive adhesive or solder, for example. Said connecting elements may be configured to co-operate with the connecting elements 16 of the structure 100 so as to provide desired functional, or specifically electrical, connection between the internals such as embedded electronics of the assembly 10 and external circuits.

The structure 100 may thus be, in accordance with a related general philosophy, a component-like entity, or an electrical node, configured to perform one or several functionalities depending on the included elements 12, 14, 16. The connection between the assembly 10 and the first substrate 20, although shown as galvanic connection, may as well be arranged electromagnetically as capacitive or inductive (or optical) connection and thus even wirelessly.

There may also be a number of potential thermal management elements that may be provided (mounted or printed, for example) within, adjacent or farther away from the assembly 10 and/or the structure 100 as well as a number of potential further elements that could be included in the assembly 10 and/or the structure 100, with reference to e.g. one or more graphical or optical elements such as light directing, blocking or processing elements (e.g. light-conveying element/lightguide, reflector, mask, collimator, diffuser, lens etc.). The further elements could include ready-made elements or printable elements using e.g. clear or colored ink, for example. In some embodiments, various elements such as any of aforementioned elements could be at least partially provided to the substrate 14 and/or the substrate film 20 using also selected subtractive technique(s) in addition to or instead of other techniques such as printing and/or mounting.

In more detail, the assembly 10 may generally comprise a number of thermal management features or elements such as a heat sink for cooling the assembly 10, particularly any of electrical elements 12, thereof. The heat sink and/or other thermal management or specifically heat exchanging feature(s) may be embedded e.g. into the first material 30 and/or provided at least partly outside of the first material 30 (utilizing e.g. a via/hole provided in the exterior optionally prior to or subsequent to e.g. provision of cover plastics thereon using e.g. molding) in order to provide cooling, for instance. Generally, a thermal management element or feature may have a high thermal conductivity and e.g. heat dissipation properties, provided by the included material(s), dimensions, shape and/or (surface) area thereof. The material(s) may include many metals (e.g. copper, silver, aluminium) and their alloys in addition to or instead of e.g. thermally conductive polymers, pastes, molded material(s), for instance. In some embodiments, a thermal management element that is essentially a thermal insulator, may be utilized in addition to or instead of thermal conductors.

A thermal management element may advantageously be configured to distribute, convey or spread thermal energy/heat within and/or outside the assembly 10. Thermal energy or heat may be conveyed to a selected or whole area of the assembly 10, and then outside the assembly 10, for example, through the first substrate 14 or the first substrate film 20 substrate, therefore, yielding e.g. more efficient cooling of the assembly 10 with respect to providing cooling at a single point. This may be particularly beneficial if the assembly 10 comprises compact high-power components, such as high-power LEDs or LED drivers, in order to avoid hotspots.

In various embodiments, the thermal conductivity of such thermal management element, or at least a part of it, may preferably be at least 2 W/m·K, or preferably at least 10 W/m·K, or more preferably at least 50 W/m·K, or most preferably at least 100 W/m·K. As being appreciated by a person skilled in the art, various materials having a lower thermal conductivity may be considered as thermal insulators whereas materials associated with a higher thermal conductivity may be generally more effectively utilized as thermal conductors e.g. for cooling/heat transfer purposes. The desired thermal conductivity may be obtained by suitable material selection of the thermal management element, for instance.

In some embodiments, plastic material having thermal conductivity at least 10 W/m·K may be utilized. In various embodiments, metal material, such as copper, aluminium, zinc, or tin-silver-copper (SnAgCu) composition, such as Sn—Ag3.5-Cu9.0, may be utilized in the thermal management element or at least in part thereof. Thermal conductivities of various such metals are of the order of at least about 60 W/m·K. Thus, quite many metals offer a better thermal conductivity than typical plastic materials, which may be exploited in various embodiments of the present invention for thermal management.

In various embodiments, the thermal management element, such as a thermal well, a thermal slug or a thermal pad, may be implemented at least partly by e.g. a lead frame, such as comprising of copper or copper alloy, of an electrical or electronics component.

Furthermore, e.g. a thermal well may be implemented by a matrix of inlets through a substrate, such as a PCB. Thermal wells may particularly advantageously be utilized in multilayer substrates. Examples of thermal slugs or pads may comprise thermally conductive material arranged on a thin-shrink small-outline package (TSSOP) or on a quadflat no-lead (QFN) package.

According to an embodiment, the assembly 10 may comprise a circuit board, such as substrate 10, or an electrical element 12 having a metal core or based on multilayer ceramics technology, such as high temperature co-fired ceramics (HTCC) or low temperature co-fired ceramics (LTCC), which may further provide cooling and/or heating through thermal conduction.

According to an embodiment, the thermal management element(s) may, in addition to or instead of comprising dedicated element(s), be integrated with a number of elements and/or components of the assembly 10. For example, this may entail utilizing electrical conductors designed with such properties, such as dimensions, that they function as a thermal management element or at least a portion thereof, such as a heat sink or thermally conductive element.

In various embodiments, the assembly 10 may comprise a thermal management element, such as at least one of the following: a heat sink, a thermal slug, a thermal well. The thermal management element may be arranged to remain fully or partly within the first material 30 or at least partly outside it, for example. The thermal management element may, additionally or alternatively, be arranged through the exterior of the assembly 10 via a cut or a through-hole, for instance. Furthermore, the thermal management element may be arranged the extend through the first substrate 10.

In some embodiments, the connecting element(s) 16, as a part of the thermal management element, may comprise or consist of material having high thermal conductivity, such as of thick copper conductors. The thermal management element or elements, such as heat pipes, may alternatively or additionally be arranged in connection with the element 16 for operating as a heat sink or to conduct heat into or out of the assembly 10 and, optionally, the first material 30.

According to various embodiments, the thermal management element(s) may have been arranged in thermal connection with external thermal management element(s) of the structure 100, such as on the first substrate film 20 outside the area of the recess 22. For example, there may be graphite or copper, such as pieces of graphite or copper tape, arranged on the first substrate film 20 with corresponding positions with the assembly 10. Still further, these thermally conductive elements could extend along the first substrate film 20 to conduct heat away, for example, from the assembly 10.

In various additional or supplementary embodiments, a number of elements 12, conductors and/or connection/contact elements 16, such as pads, comprise at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

In various embodiments, selected features including also e.g. graphics, coloring or other visual features may be provided on internal surfaces or layers of the structure 100. Accordingly, different impacts, rubbing, chemicals, etc. that could easily damage e.g. painted, printed or mounted surface features do not affect or reach the embedded/non-surface features. Relating covering layers such as film(s) or the elastic (fill) material(s) may be manufactured or processed, optionally cut, carved, etched or drilled into a desired shape with necessary characteristics such as holes or notches for exposing the underlying features such as material layers or e.g. electrical elements to a selected extent to the environment.

Figure 3:
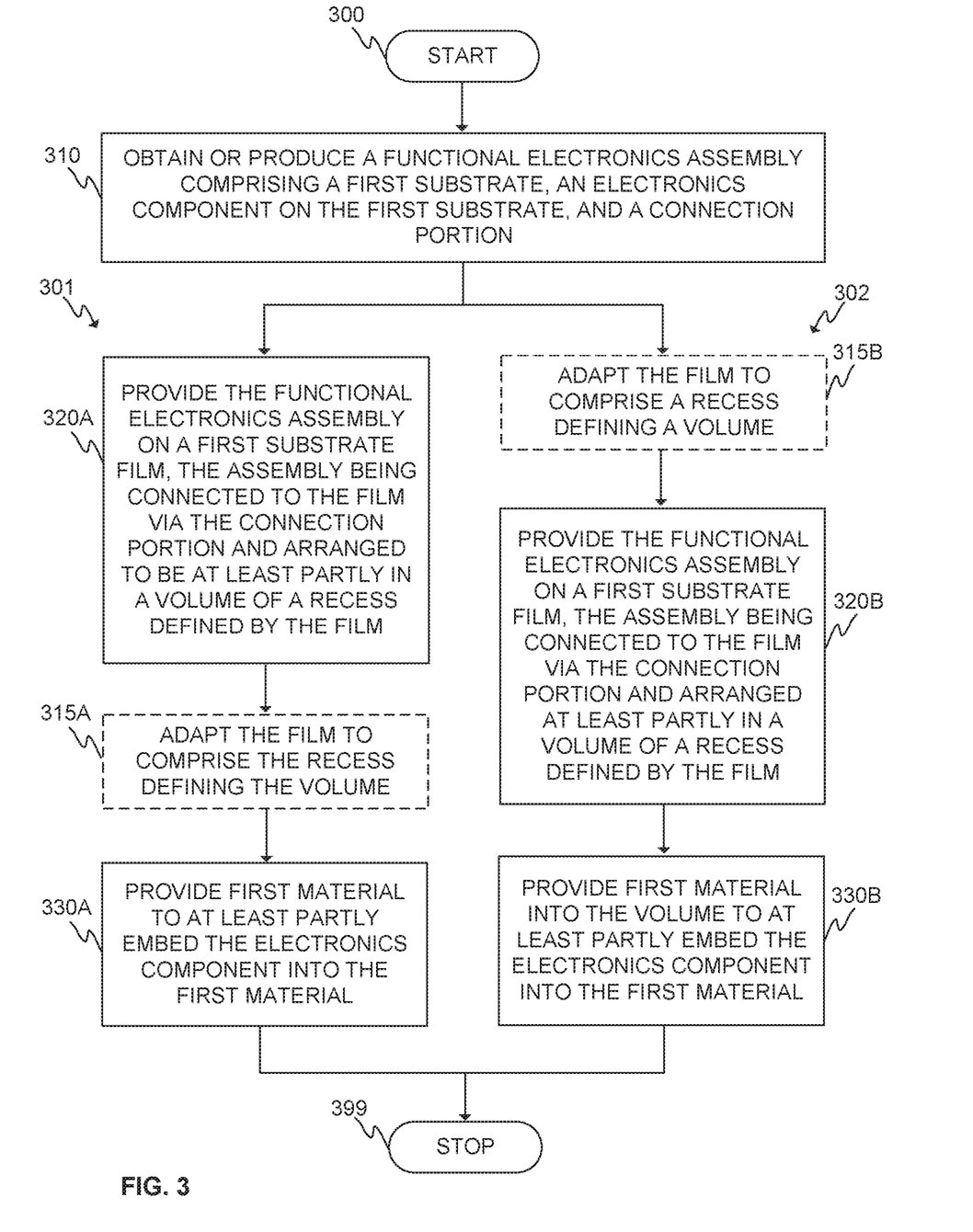
FIG. 3 shows a flow diagram of methods according to some embodiments of the present invention.

FIG. 3 shows a flow diagram of methods according to some embodiments of the present invention. The flow diagram includes two alternative paths 301 and 302 representing different embodiments.

Step 300 refers to a start-up phase of the method. Suitable equipment and components are obtained and systems assembled and configured for operation. This may mean obtaining and configuring a printing device for producing conductive traces on a substrate or a substrate film. Furthermore, this may entail obtaining and configuring a device for mounting electronic components based on a surface-mount technology, for instance.

Step 310 refers to obtaining or producing a functional electronics assembly 10 comprising at least a first substrate 14, at least one electronics component 12, preferably a plurality of electronics components 12, on the first substrate 14, and at least one, or a plurality of, connection portion(s) 18, providing the connection in wired or wireless manner.

Starting from path 301, the method may further comprise step 320A referring to providing the functional electronics assembly 10 on a first substrate film 20, such as by placing the assembly thereon or manufacturing the assembly thereon directly, wherein the functional electronics assembly 10 may be connected to the first substrate film 20 via the at least one connection portion 18. This may include electrical connection means, that is providing an electrical connection to and/or from the assembly 10 from and/or to an external circuit, such as on the substrate film 20, or may simply be a mechanical connection to the film 20, such as attaching the assembly 10 thereto.

Step 330A refers to adapting the first substrate film 20 to produce the recess 22, preferably, at the position of the functional electronics assembly 10. The adapting may comprise, for example, forming, such as one of the following: thermoforming, cold forming, vacuum forming, low pressure forming, pressure forming, utilizing the Niebling process. Thus, the assembly 10 may be "pulled" into to the recess 22 or basically the film 20 is adapted, or formed, so that the assembly 10, or at least the electronics component(s) 12 thereon, become(s) arranged into the volume 24 defined by the recess 22.

Step 340A refers to providing first material 30 to at least partly embed the at least one electronics component 12 into the first material 30. In various embodiments, the first material 30 is provided into the recess 22.

Alternatively, the order of steps 330A and 340A may be changed with respect to each other. This means that the first material 30 is provided to at least partly embed the at least one electronics component 12 therein prior to adapting the first substrate film 20 to comprise the recess 22. This is described in more detail hereinbelow in connection with FIG. 6.

Referring now to the alternative path 302, there may, optionally, be performed the step 315B which refers to adapting, such as forming, such as one of the following: thermoforming, cold forming, vacuum forming, low pressure forming, pressure forming, utilizing the Niebling process, the first substrate film 20 to comprise the recess 22 defining the volume 24. Alternatively, the first substrate film 20 may already comprise the recess 22 as a ready-made feature.

The method may further comprise step 320B referring to providing the functional electronics assembly 10 on a first substrate film 20, such as by placing the assembly thereon or manufacturing the assembly thereon directly, wherein the functional electronics assembly 10 may be connected to the first substrate film 20 via the at least one connection portion 18 and arranged to be at least partly into the volume 24 of recess 22. The connection may include electrical connection means, that is providing an electrical connection to and/or from the assembly 10 from and/or to an external circuit, such as on the substrate film 20, or may simply be a mechanical connection to the film 20, such as attaching the assembly 10 thereto.

Step 340B refers to providing first material 30 into the volume 24 to at least partly embed the at least one electronics component 12 into the first material 30. In various embodiments, the first material 30 is provided into the recess 22.

With respect to steps 340A and 340B, the first material 30 may be cured, at least the surface thereof, such as by utilizing an ultraviolet (UV) radiation.

With respect to steps 340A and 340B, the first material 30 is preferably provided in a flowable state. In various embodiments, the first material is one of the following: ethyl carbamate, epoxy, poly(methyl methacrylate), copolyester, or polymer, such as polyurethane or siloxane.

Furthermore, alternatively or in addition, such as with respect to steps 340A and 340B, a thermoset material may be utilized as the first material 30 and may be dispensed and allowed to flow and fill the recess, and then cured.

Optionally, a UV fixable material may be utilized as a first material 30 to facilitate processing as it does not flow out of shape once fixed, for example, in a case that the first substrate film 20 needs to be tilted to let the first material 30 to fill other or all portions of the volume 24 of the recess 22 as well.

In another embodiment, a thermoplastic material as the first material 30 may be provided into the recess 22 in a flowable state.

According to various embodiments, and also with respect to paths 301 or 302 as the case may be, the method may comprise injection molding a material layer 40, such as of plastic material, on the first substrate film 20 to embed the first material 30, and thereby also the functional electronics assembly 10, in the material layer 40, or between the material layer 40 and the substrate film 20.

Method execution may be stopped at step 399. The post-processing steps may be performed depending on the embodiment. For example, if an injection molding material layer 40 was provided, the post-processing may mean letting the structure 100 to cool down before ejecting it from the injection molding device or mold.

Figure 7:
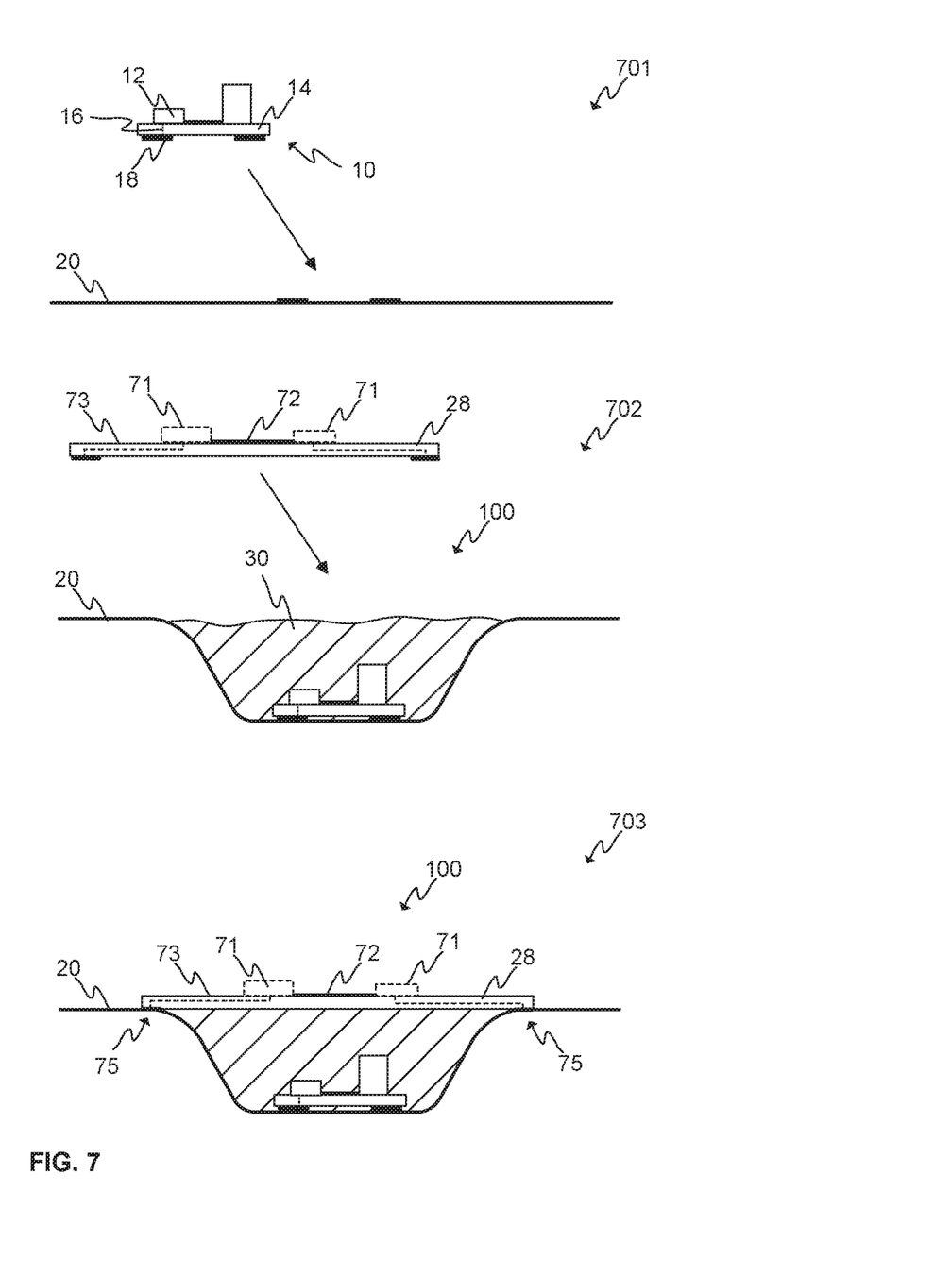
FIG. 7 illustrates some process phases related to a method in accordance with an embodiment of the present invention.
Figure 8:
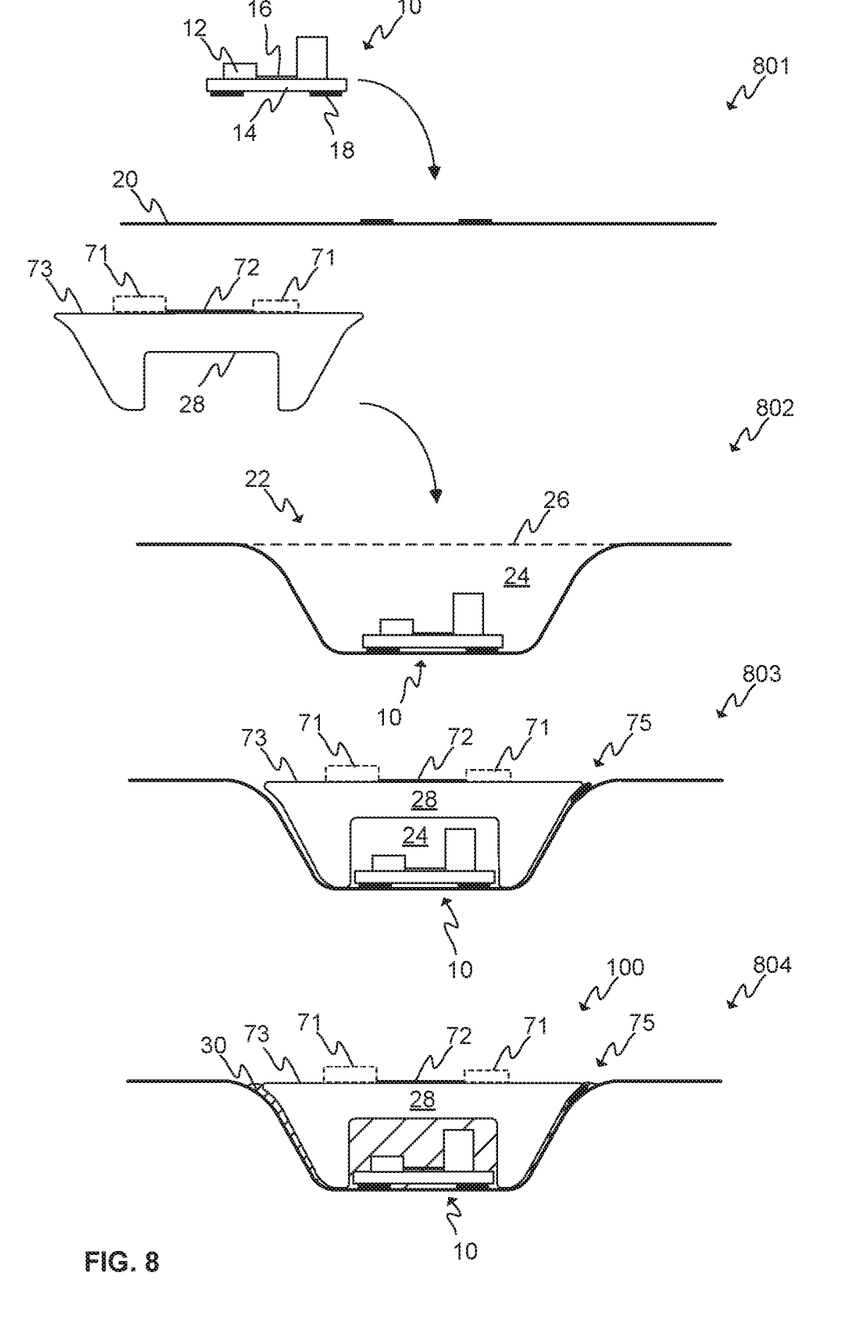
FIG. 8 illustrates some process phases related to a method in accordance with an embodiment of the present invention.
Figure 10:
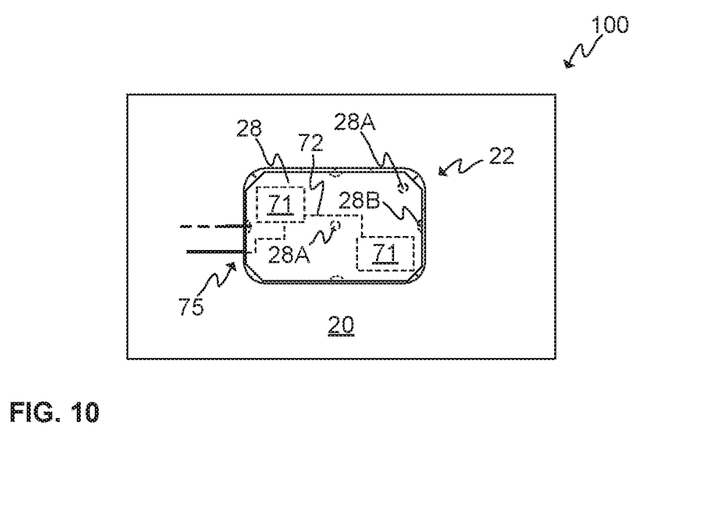
FIG. 10 illustrates schematically a structure according to an embodiment of the present invention.

In various embodiments, the method may further comprise providing a lid member to cover the recess 22. The lid member may be a thermoplastic film, or at least a piece of the film, to act as a lid to the recess 22. Preferably, the lid member may be functional, such as having certain specific optical and/or mechanical properties. For example, the lid member may be of material having light diffusing or opalescent properties. One advantage of this is that it enables a cover material layer, that is defined by the lid member, between the first material 30 and the injection molded thermoplastic, wherein the cover material layer preferably provides adherence for the injection molded thermoplastic material. In this case, it is not necessary, although in many embodiments beneficial, for the first material 30 to provide such adherence. The material of the lid member may be, for example, PC. Some examples of the lid member are shown in FIGS. 7, 8, and 10.

In various embodiments, the lid member 28 may at least partly conform to the shape of a portion of the recess 22 surrounding the functional electronics assembly 10. One example of this is shown in FIG. 8. Regarding the lid member 28 conforming to the shape of the recess 22, such a lid member 28 enables even using fluids to be used as the first material 30. Thus, there may be no strict need to harden or cure the first material 30.

In various embodiments, the lid member 28 may be of plastic material.

Alternatively or in addition, the lid member 28 may be configured to facilitate management of thermal expansion.

In an embodiments, the lid member 28 may be of material which is substantially, or at least partly, transparent for ultraviolet radiation. Thus, the first material 30 may be cured by radiating UV through the lid member 28. The lid member 28 may, preferably, be insensitive to curing.

In an embodiment, the cover material layer may further be provided with functional features, such as (printed) electronic components, or (printed) conductive traces or pads. Additionally, the cover material layer may be further electrically connected to an external circuit, such as on the first substrate film 20. This provides the advantage that the space over the recess 22 can be efficiently utilized.

Figure 4:
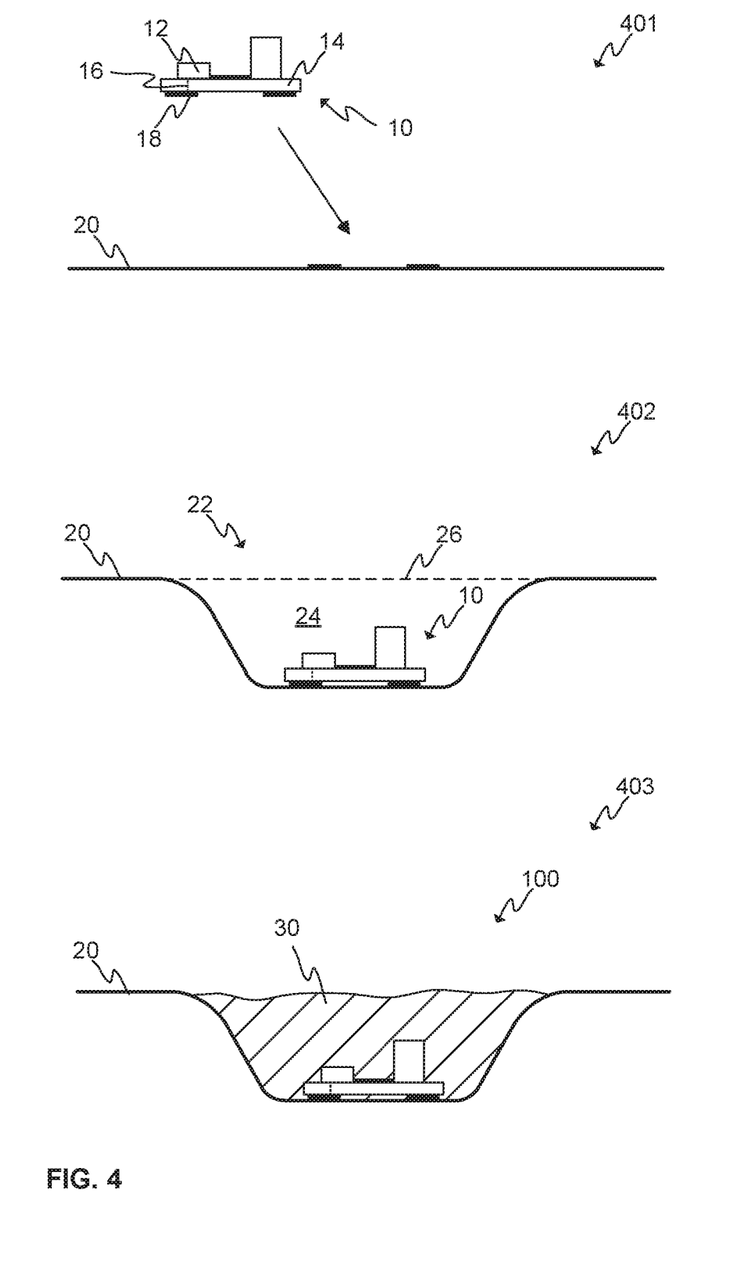
FIG. 4 illustrates some process phases related to a method in accordance with an embodiment of the present invention.

FIG. 4 illustrates some process phases related to a method in accordance with an embodiment of the present invention. In FIG. 4, at 401, the functional electronics assembly 10 comprising at least a first substrate 14, at least one electronics component 12 on the first substrate 14, and at least one connection portion 18 is obtained or manufactured. Optionally, the at least one electronics component 12 may be arranged on opposite side of the first substrate 14 relative to the connection portion 18.

In FIG. 4, at 402, the functional electronics assembly 10 is provided on the first substrate film 20, wherein the functional electronics assembly 10 is connected to the first substrate film 20 via the at least one connection portion 18.

The first substrate film 20 may comprise a recess 22 prior to providing the functional electronics assembly 10 or, alternatively, the functional electronics assembly 10 is provided on the first substrate film 20 and the first substrate film 20 is subsequently being adapted, for example formed, at the position of the functional electronics assembly 10 so that the functional electronics assembly 10 is arranged into the recess 22 after being provided onto the first substrate film 20.

In FIG. 4, at 403, first material 30 is provided into the volume 24 defined by the recess 22 so as to at least partly embed the at least one electronics component 12 into the first material 30.

Figure 5:
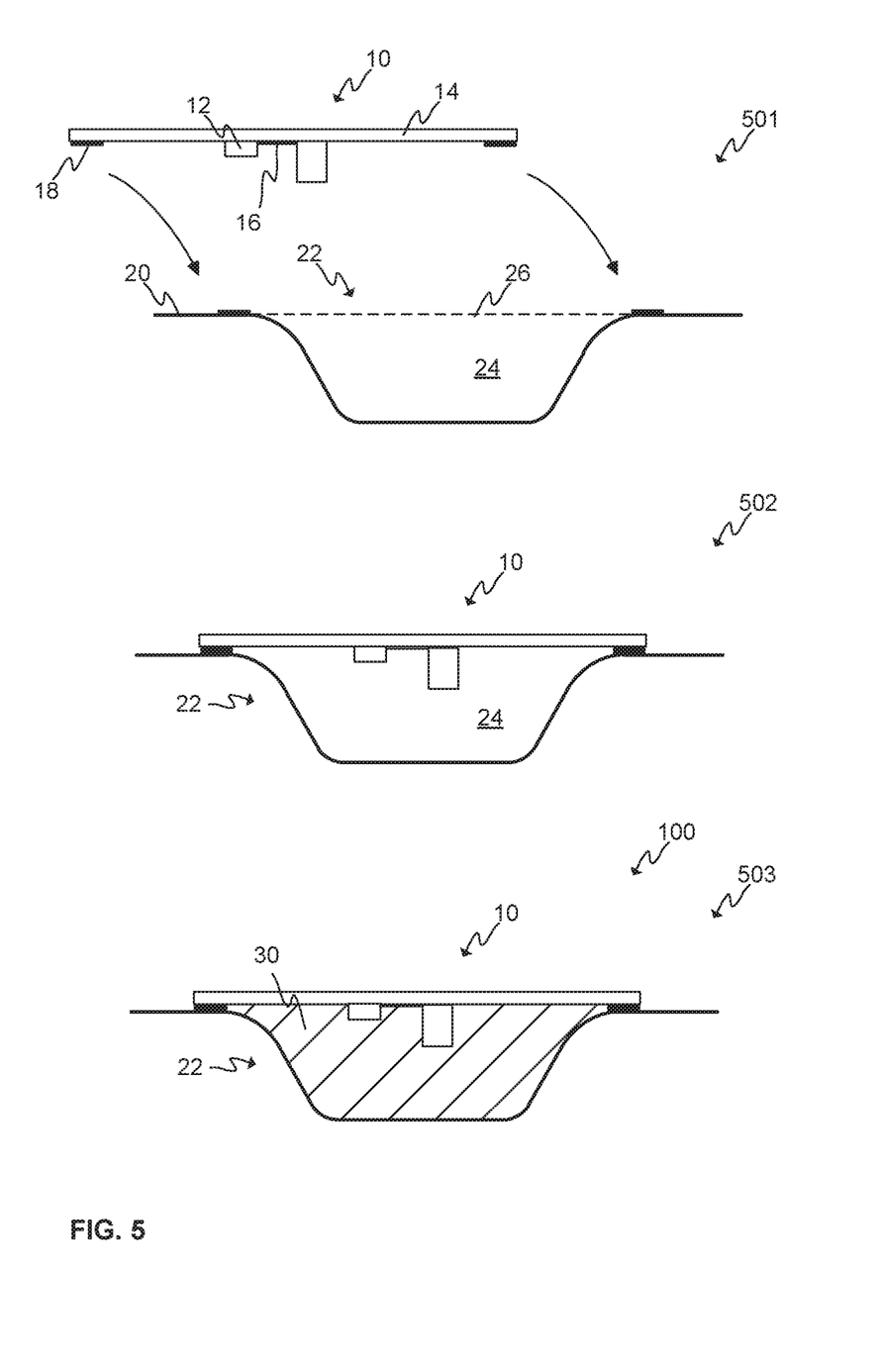
FIG. 5 illustrates some process phases related to a method in accordance with an embodiment of the present invention.

FIG. 5 some process phases related to a method in accordance with an embodiment of the present invention. In FIG. 5, at 501, the functional electronics assembly 10 comprising at least a first substrate 14, at least one electronics component 12 on the first substrate 14, and at least one connection portion 18 is obtained or manufactured. Optionally, the at least one electronics component 12 may be arranged on the same side of the first substrate 14 relative to the connection portion 18.

In FIG. 5, at 502, the functional electronics assembly 10 is provided on the first substrate film 20 which comprises the recess 22. The functional electronics assembly 10 may then be connected to the first substrate film 20 via the at least one connection portion 18 such that the at least one electronics component 12 is arranged at least partly in the volume 24.

In FIG. 5, at 503, first material 30 is provided into the volume 24 defined by the recess 22 so as to at least partly embed the at least one electronics component 12 into the first material 30.

Figure 6:
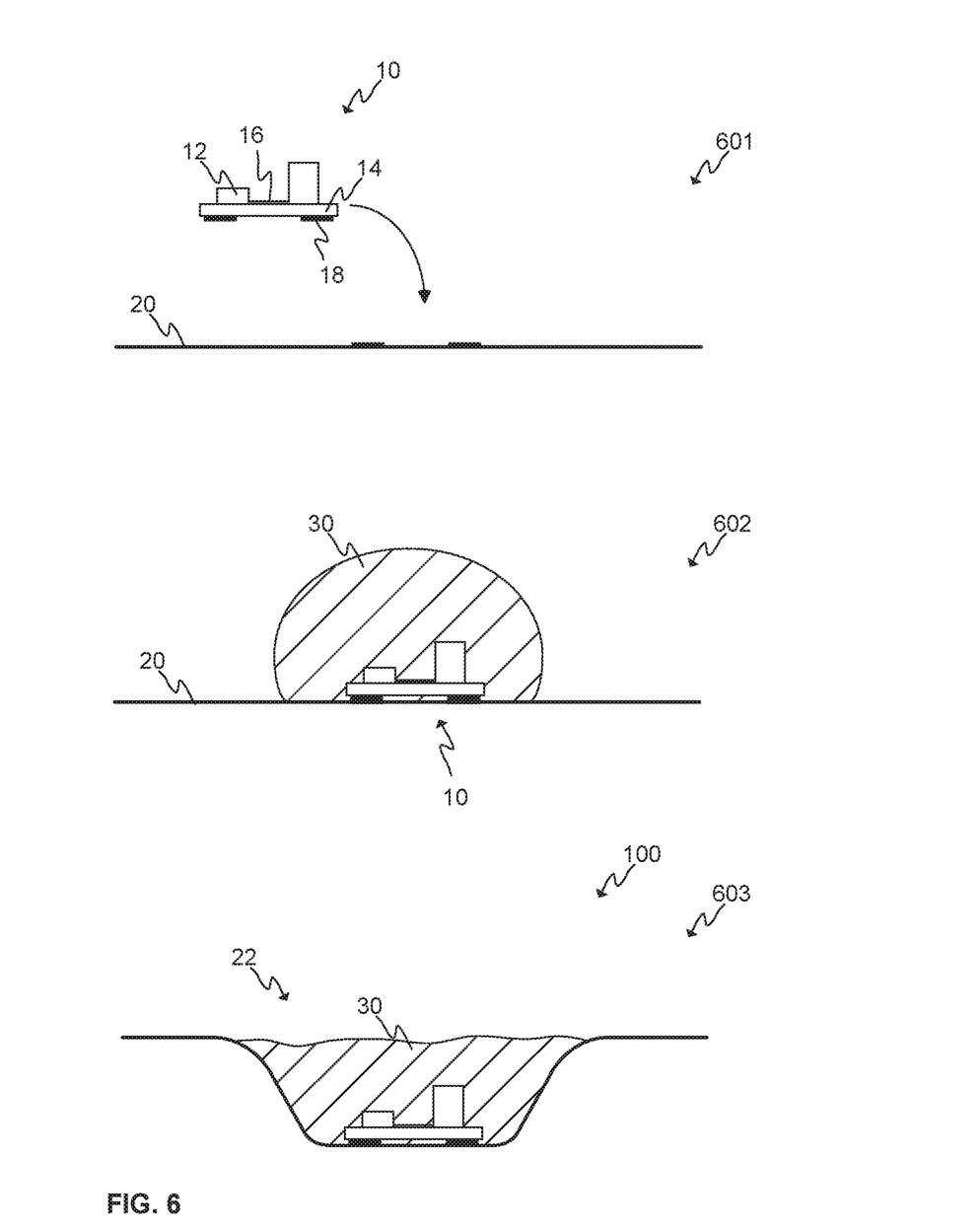
FIG. 6 illustrates some process phases related to a method in accordance with an embodiment of the present invention.

FIG. 6 illustrates some process phases related to a method in accordance with an embodiment of the present invention. In FIG. 6, at 601, the functional electronics assembly 10 comprising at least a first substrate 14, at least one electronics component 12 on the first substrate 14, and at least one connection portion 18 is obtained or manufactured. Optionally, the at least one electronics component 12 may be arranged on opposite side of the first substrate 14 relative to the connection portion 18.

In FIG. 6, at 602, the functional electronics assembly 10 is provided or manufactured on the first substrate film 20. The functional electronics assembly 10 may thus be connected to the first substrate film 20 via the at least one connection portion 18. Furthermore, at 602, first material 30 is provided so as to at least partly embed the at least one electronics component 12 into the first material 30.

At 603, the first substrate film 20 may subsequently be adapted, preferably formed, at the position of the functional electronics assembly 10 so that the functional electronics assembly 10 is arranged into the recess 22 after being provided onto the first substrate film 20. Thereby, the first material 30, which is already provided to at least partly embed the at least one electronics component 12, is further provided into the recess 22 during the adapting of the first substrate film 20. In various embodiments, the surface of the first material 30 after the adapting forms flat surface over the recess 22 with relative to the surface of the surrounding portions of the first substrate film 20.

In various embodiments, at least the surface of the first material 30 may be cured, such as by an ultraviolet light, so that the first material 30 has a harder outer surface and softer inner portion. The inner portion may even be in liquid state or at least in flowable state.

The harder outer surface forms a cover surface on the recess after the adapting of the first substrate film 20 at the position of the functional electronics assembly 10. The curing may preferably be performed prior to the adapting of the first substrate film 20 or, alternatively, after the adapting.

Additionally, in case of utilizing heat during the adapting, such as in thermoforming, the first material 30 may be heated after being provided onto the first substrate film 20 but before the adapting so that the substrate film 20 heating time is not increased, at least severely. The heating of the first material 30 may include heating it to at least a temperature which is half of the temperature required during the adapting. In some embodiments, the heating of the first material 30 may include heating it to a temperature substantially corresponding to the temperature required during the adapting.

FIG. 7 illustrates some process phases related to a method in accordance with an embodiment of the present invention. Phases shown in FIG. 7, at 701 and 702, substantially correspond to the phases shown in FIG. 4, at 401 to 403. However, in FIG. 7, at 702 and 703, a lid member 28 is obtained and has been provided to at least partly, if not completely, cover the recess 22. The lid member 28 may be, for example, attached to the first substrate film 20, such as by applying conductive glue to the coupling point 75. Alternatively, the lid member 28 may be attached to the first substrate film 20 mechanically and electrical connections, if any, may be established by other means.

Furthermore, optionally, the outer surface 73 of the lid member 28 may comprise at least one further electronics component 71, the outer surface 73 preferably being the surface on the opposite side of the lid member 28 relative to the recess 22. There may also be provided further electrical connection elements 72, such as (printed) traces to form an electrical circuit on the outer surface 73. Thus, the area over the recess 22 may be more efficiently utilized as the lid member 28 may have functionalities or at least space for wiring, traces, electronic components, etc.

FIG. 8 illustrates some process phases related to a method in accordance with an embodiment of the present invention. Phases shown in FIG. 8, at 801 and 804, substantially correspond to the phases shown in FIG. 4, at 401 and 403. However, in FIG. 8, at 802 and 803, a lid member 28 is obtained and has been provided to cover the recess 22. In this embodiment, the lid member 28 at least partly conforms to the shape of a portion of the recess 22 surrounding the functional electronics assembly 10. As can be seen, the lid member 28 has been shaped to conform with the portion of the volume 24 of the recess 22 which is not occupied by the functional electronics assembly 10. The surface of the lid member 28 facing away from the recess 22, that is towards the end not having a portion of the first substrate film 20, may be configured to essentially align with the surrounding portions of the first substrate film 20 in order to provide a uniform surface as already explained hereinabove. In some embodiments, the lid member 28 may be a thermoplastic film.

The lid member 28 may be, for example, attached to the first substrate film 20, such as by applying conductive glue to the coupling point 75. Alternatively, the lid member 28 may be attached to the first substrate film 20 mechanically and electrical connections, if any, may be established by other means.

Furthermore, optionally, the outer surface 73 of the lid member 28 may comprise at least one further electronics component 71, the outer surface 73 preferably being the surface on the opposite side of the lid member 28 relative to the recess 22. There may also be provided further electrical connection elements 72, such as (printed) traces to form an electrical circuit on the outer surface 73. Thus, the area over the recess 22 may be more efficiently utilized as the lid member 28 may have functionalities or at least space for wiring, traces, electronic components, etc.

It should be noted, however, that the lid member 28 may alternatively have some other shape, such as merely providing a cover over the recess 22. Other shapes are also possible as long as the lid member 28 is substantially inside the volume 24 of the recess 22.

In FIG. 8, at 804, first material 30 is provided into the volume 24 defined by the recess 22 so as to at least partly embed the at least one electronics component 12 into the first material 30, however, naturally the first material 30 is provided to portions of the recess 22 not occupied by the lid member 28.

Figure 9A:
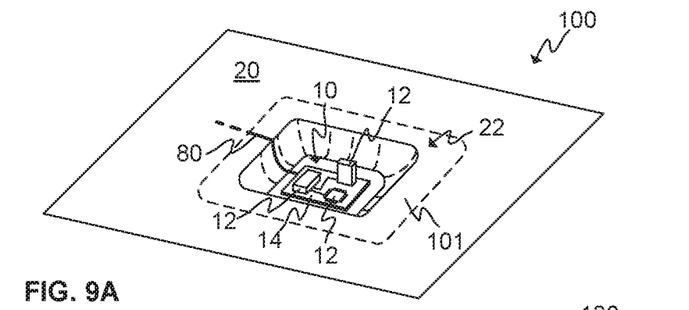
FIGS. 9A and 9B illustrate schematically a structure according to an embodiment of the present invention.
Figure 9B:
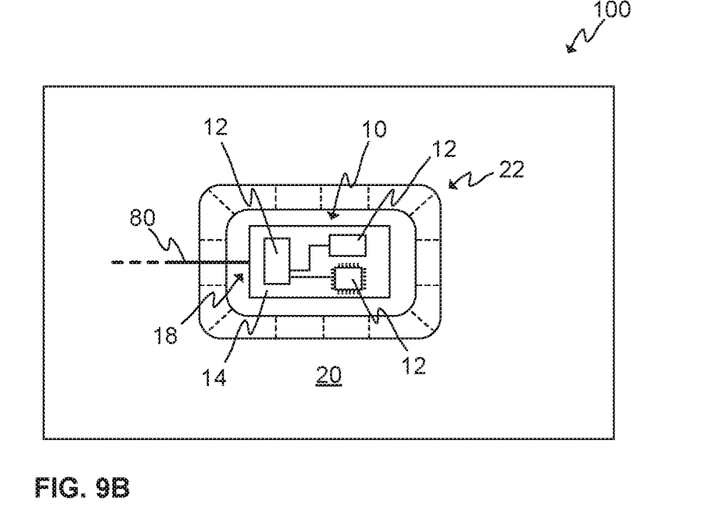

FIGS. 9A and 9B illustrates schematically a structure 100 according to an embodiment of the present invention. FIG. 9A illustrates a perspective view of the structure 100. FIG. 9B illustrates the structure 100 from above, that is from the side of the structure 100 having the open end of the recess 22 or the end which is not limited by the first substrate film 20. In FIGS. 9A and 9B, the first material 30 is not shown. FIG. 9A shows an example of the surrounding portion 101 of the first substrate film 20 which has also been referred to hereinearlier. The first material layer 30 may, in various embodiments, be arranged to provide a surface which align with the surface defined by the surrounding portions 101. The surfaces are not necessarily planar but may be, for example, slightly curved and/or may have texture or surface structures which are not completely smooth.

FIGS. 9A and 9B illustrate a connection element 80, such as a (printed) conductor or trace. The connection element 80 may be provided to the first substrate film 20 prior to or after the adapting, such as forming, of the film 20. The connection element 80 may further define a counterpart for the connection portion 18 of the assembly 10. Although shown here as being a trace-like element, the connection element 80 can in various embodiments, at least partly, be or comprise an element for wireless power or data transfer, such as a (printed) pad suitable for capacitive coupling. Antenna and/or inductive elements are also possible.

FIG. 10 illustrates schematically a structure 100 according to an embodiment of the present invention. As described hereinearlier, for example, in connection with FIG. 8, there may be a lid member 28 arranged into the recess 22. Although the lid member 28 may be, for example, merely a piece of film or substrate, in FIG. 10 is shown from the same perspective and for a similar structure as in FIG. 9B, a lid member 28 which at least partly conforms to the shape of the recess 22. It is to be understood that the lid member 28 preferably includes, such as shown in FIG. 8, an open space for the components of the assembly 10. As can be seen in FIG. 10, the lid member 28 may be somewhat smaller than the recess 22 and may, optionally, comprise shapes which facilitate the fitting of the lid member 28 into the recess 22 and/or providing of the first material 30 into the recess 22 if the lid member 28 is already provided therein. The lid member according to various embodiments may comprise holes or channels 28A, 28B for providing the first material 30 into the recess 22.

Furthermore, what is stated hereinbefore about the lid member 28 with respect to the attachment thereof and the further electronics components 71 etc. arranged thereon, apply also to the embodiment of FIG. 10.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For instance, instead of or in addition to molding or casting material layers, a layer could be prepared upfront and then attached, e.g. to the first substrate film 20 or the first substrate 14, by suitable lamination technique applying e.g. adhesive, mechanical attachment means (screws, bolts, nails, etc.), pressure and/or heat. Finally, in some scenarios, instead of molding or casting, the plastic or other layer could be produced on the target substrate(s) using a suitable deposition or a further alternative method.

The invention claimed is:

1. A method of manufacture of a structure, comprising:
obtaining or producing a functional electronics assembly comprising at least a first substrate, at least one electronics component on the first substrate, and at least one connection portion;
providing the functional electronics assembly on a first substrate film, wherein the functional electronics assembly is connected to the first substrate film via the at least one connection portion;
providing first material to at least partly embed the at least one electronics component into the first material; and
wherein the first substrate film is adapted to comprise a recess defining a volume, and the at least one electronics component is arranged at least partly in the volume, wherein the adapting comprises forming the first substrate film to produce the recess, and wherein the forming comprises one of the following: thermoforming, cold forming, vacuum forming, low pressure forming, pressure forming, or utilizing the Niebling process.

2. The method of claim 1, wherein the first material is provided in a flowable state.

3. The method of claim 1, wherein the adapting comprises forming the first substrate film at least at a position of the functional electronics assembly provided on the first substrate film to arrange the functional electronics assembly into the recess.

4. The method of claim 1, wherein the first material is provided into the recess.

5. The method of claim 1, wherein the first material is provided to at least partially embed the at least one electronics component of the functional electronics assembly being provided on the first substrate film, the providing being performed prior to the adapting of the first substrate film to comprise the recess.

6. The method of claim 5, comprising curing a surface layer of the first material prior to the adapting.

7. The method of claim 1, comprising providing the functional electronics assembly to the first substrate film so that a surface on opposite side of the first substrate relative to a side comprising the at least one electronics component is arranged to cover the recess and face away from the recess.

8. The method of claim 1, wherein an outer surface facing out of the recess is defined by the first material.

9. The method of claim 1, comprising providing a lid member to cover the recess.

10. The method of claim 9, wherein the lid member is a thermoplastic film.

11. The method of claim 9, wherein the lid member at least partly conforms to the shape of a portion of the recess surrounding the functional electronics assembly.

12. The method of claim 1, wherein an outer surface facing out of the recess is configured to provide an adhesion surface for a material layer to be molded on the surface.

13. The method of claim 7, wherein the outer surface is the surface on the opposite side, the outer surface defined by the first material, or a surface of the lid member facing away from the recess, respectively.

14. The method of claim 1, comprising configuring a surface of the recess facing away from the recess to align with surrounding surface portions of the first substrate film to at least locally provide a uniform surface at and in vicinity of but outside the recess.

15. The method of claim 1, wherein the functional electronics assembly is a component-like element, such as able to be assembled by a surface mount technology component placement system.

16. The method of claim 1, comprising injection molding a material layer on the first substrate film to embed the first material, and thereby also the functional electronics assembly, in the material layer.

17. A method of manufacture of a structure, comprising:
obtaining or producing a functional electronics assembly comprising at least a first substrate, at least one electronics component on the first substrate, and at least one connection portion;
providing the functional electronics assembly on a first substrate film, wherein the functional electronics assembly is connected to the first substrate film via the at least one connection portion;
providing first material to at least partly embed the at least one electronics component into the first material, wherein the first substrate film is adapted to comprise a recess defining a volume, and the at least one electronics component is arranged at least partly in the volume; and
providing the functional electronics assembly to the first substrate film so that a surface on opposite side of the first substrate relative to a side comprising the at least one electronics component is arranged to cover the recess and face away from the recess.

18. A method of manufacture of a structure, comprising:
obtaining or producing a functional electronics assembly comprising at least a first substrate, at least one electronics component on the first substrate, and at least one connection portion;
providing the functional electronics assembly on a first substrate film, wherein the functional electronics assembly is connected to the first substrate film via the at least one connection portion;
providing first material to at least partly embed the at least one electronics component into the first material, wherein the first substrate film is adapted to comprise a recess defining a volume, and the at least one electronics component is arranged at least partly in the volume; and
providing a lid member to cover the recess.

* * * * *